US012720704B2

(12) United States Patent
Gu et al.

(10) Patent No.: US 12,720,704 B2
(45) Date of Patent: Aug. 25, 2026

(54) AIR CONDITIONER

(71) Applicants: GD Midea Heating & Ventilating Equipment Co., Ltd., Foshan (CN); Hefei Midea Heating & Ventilating Equipment Co., Ltd., Hefei (CN)

(72) Inventors: Yong Gu, Foshan (CN); Changli Kan, Foshan (CN); Baisong Zhou, Foshan (CN); Menghao Zhu, Foshan (CN); Yunzhi Li, Foshan (CN); Yang Xi, Foshan (CN); Shanshan Ge, Foshan (CN); Lin Wu, Foshan (CN)

(73) Assignees: GD MIDEA HEATING & VENTILATING EQUIPMENT CO., LTD., Foshan (CN); HEFEI MIDEA HEATING & VENTILATING EQUIPMENT CO., LTD., Hefei (CN)

( * ) Notice: Subject to any disclaimer, the term of this patent is extended or adjusted under 35 U.S.C. 154(b) by 296 days.

(21) Appl. No.: 18/386,566

(22) Filed: Nov. 2, 2023

(65) Prior Publication Data

US 2024/0064927 A1 Feb. 22, 2024

Related U.S. Application Data

(63) Continuation of application No. PCT/CN2021/134244, filed on Nov. 30, 2021.

(30) Foreign Application Priority Data

Jun. 8, 2021 (CN) ........................ 202110636362.X

(51) Int. Cl.
*H05K 7/20* (2006.01)
*F24F 11/89* (2018.01)

(52) U.S. Cl.
CPC .......... *H05K 7/20136* (2013.01); *F24F 11/89* (2018.01)

(58) Field of Classification Search
CPC ............................ H05K 7/20136; F24F 11/89
See application file for complete search history.

(56) References Cited

U.S. PATENT DOCUMENTS 5,131,463 A * 7/1992 Zimmerli ................ F28F 19/01 165/125
10,429,089 B2 10/2019 Jeon
(Continued)

FOREIGN PATENT DOCUMENTS

CN 1240914 A 1/2000
CN 202734156 U 2/2013
(Continued)

OTHER PUBLICATIONS

Tanaka, Electronic Circuit Board, Electrical Component Box and Air Conditioner, Oct. 10, 2019, JP2019175940A, Whole Document (Year: 2019).*

(Continued)

*Primary Examiner* — Larry L Furdge
(74) *Attorney, Agent, or Firm* — Morgan, Lewis & Bockius LLP

(57) ABSTRACT

An air conditioner includes: a housing having a fan cavity and a heat exchange cavity in communication with each other; an electric control box disposed in the housing and in communication with the heat exchange cavity and the fan cavity; an electric control disposed in the electric control box; and a fan assembly disposed in the fan cavity and configured to supply air to the heat exchange cavity and dissipate heat of the electric control box. A circulating flow path is formed inside the air conditioner, to allow an airflow in the fan cavity flowing into the heat exchange cavity to at (Continued)

least partially flow into the electric control box and flow back to the fan cavity through the electric control box.

16 Claims, 4 Drawing Sheets

(56) References Cited

U.S. PATENT DOCUMENTS

| | | | |
|---|---|---|---|
| 2015/0009626 | A1 | 1/2015 | Lam et al. |
| 2024/0064927 | A1 | 2/2024 | Gu et al. |

FOREIGN PATENT DOCUMENTS

| | | | | |
|---|---|---|---|---|
| CN | 103363597 | A | | 10/2013 |
| CN | 104776518 | A | | 7/2015 |
| CN | 205980012 | U | | 2/2017 |
| CN | 209042573 | U | | 6/2019 |
| CN | 209558628 | U | | 10/2019 |
| CN | 110848946 | A | | 2/2020 |
| CN | 212005991 | U | | 11/2020 |
| CN | 212746712 | U | | 3/2021 |
| CN | 212777670 | U | | 3/2021 |
| JP | S 6021638 | U | | 2/1985 |
| JP | 2002022209 | A | | 1/2002 |
| JP | 3276236 | B2 | | 4/2002 |
| JP | 3103921 | U | | 6/2004 |
| JP | 2006097995 | A | | 4/2006 |
| JP | 2007046795 | A | | 2/2007 |
| JP | 2009030829 | A | | 2/2009 |
| JP | 5549817 | B2 | | 7/2014 |
| JP | 2019175940 | A | * | 10/2019 |
| JP | 2021018014 | A | | 2/2021 |
| KR | 100765197 | B1 | | 10/2007 |
| WO | WO 2022257374 | A1 | | 12/2002 |

OTHER PUBLICATIONS

Midea Group Co., Ltd., ISR, PCT/CN2021/134244, Feb. 17, 2022, 2 pgs.

Midea Group Co., Ltd., Japanese Office Action, JP Patent Application 2023-571201, Dec. 16, 2024, 5 pgs.

Midea Group Co., Ltd., Canadian Office Action, CA Patent Application No. 3,216,249, Jan. 30, 2025, 3 pgs.

Midea Group Co., Ltd., Written Opinion, PCT/CN2021/134244, Feb. 17, 2022, 4 pgs.

Midea Group Co., Ltd., IPRP, PCT/CN2021/134244, Nov. 21, 2023, 5 pgs.

Midea Group Co., Ltd., Chinese Office Action, CN Patent Application No. 202110636362, Mar. 20, 2024, 11 pgs.

Midea Group Co., Ltd., Brazilian Search Report, BR Patent Application No. BR112023023169-8, Apr. 16, 2024, 8 pgs.

Midea Group Co., Ltd., Australian Office Action, AU Patent Application No. 2021450239, Apr. 1, 2025, 4 pgs.

Midea Group Co., Ltd., Korean Office Action, KR Patent Application No. 10-2023-7038598, May 29, 2025, 10 pgs.

Midea Group Co., Ltd., Chinese Second Office Action, CN Patent Application No. 202110636362.X, Sep. 15, 2024, 13 pgs.

Midea Group Co., Ltd., Australian Office Action, AU Patent Application No. 2021450239, Sep. 16, 2024, 4 pgs.

Midea Group Co., Ltd., Extended European Search Report, EP Patent Application No. 21944870.1, 12JUN204, 9 pgs.

Midea Group Co., Ltd., European Office Action, EP Patent Application No. 21944870.1, Mar. 2, 2026, 8 pgs.

Midea Group Co., Ltd., Korean Office Action, KR Patent Application No. 10-2023-7038598, Jan. 24, 2026, 6 pgs.

Midea Group Co., Ltd., Vietnamese Office Action, VN Patent Application No. 1-2023-08455, Feb. 5, 2026, 4 pgs.

* cited by examiner

AIR CONDITIONER

This application is a continuation of International (PCT) Patent Application No. PCT/CN2021/134244 filed on Nov. 30, 2021, which claims a priority to Chinese Patent Application No. 202110636362.X, titled "AIR CONDITIONER" and filed with China National Intellectual Property Administration on Jun. 8, 2021, the entire contents of which are incorporated herein by reference.

FIELD

The present disclosure relates to the field of air conditioning technologies, and more particularly, to an air conditioner.

BACKGROUND

Electric controls such as a motor drive module may generate heat during use. A heat dissipation member may be disposed in an electric control box. However, the heat dissipation member may have a low heat dissipation efficiency, and may fail to effectively satisfy heat dissipation demand of the electric controls and/or of an interior of the electric control box, which may result in damages to the electric controls.

SUMMARY

According to embodiments of the present disclosure, an air conditioner is provided. The air conditioner includes: a housing having a fan cavity and a heat exchange cavity in communication with each other; an electric control box disposed in the housing and in communication with the heat exchange cavity and the fan cavity; an electric control disposed in the electric control box; and a fan assembly disposed in the fan cavity. The fan assembly is configured to supply air to the heat exchange cavity and dissipate heat of the electric control box.

The air conditioner according to the embodiments of the present disclosure includes the housing, the electric control box, the electric control, and the fan assembly. In an air supply direction of the air conditioner, the housing has the fan cavity and the heat exchange cavity in communication with each other. The electric control box is disposed in the housing and is in communication with the heat exchange cavity and the fan cavity. The electric control is disposed in the electric control box and can ensure that the whole air conditioner is operated under control. The fan assembly is disposed in the fan cavity and is configured to supply the air to the heat exchange cavity during operation.

In some embodiments, the fan assembly can supply the air to the heat exchange cavity during operation, which increases a pressure in the heat exchange cavity to be higher than a pressure in the electric control box and a pressure in the fan cavity. Therefore, during the operation of the air conditioner, due to a pressure difference between the heat exchange cavity and the electric control box, an airflow in the heat exchange cavity at least partially flows into the electric control box, and flows back to the fan cavity after flowing through the electric control box. During use of the air conditioner, the electric control will generate heat, and thus a temperature in the electric control box will rise. The high temperature will easily result in damages to the electric control and affect a service life of the electric control. Therefore, the airflow flowing through the electric control box can effectively dissipate heat of the electric control box and the electric control in the electric control box, which can ensure an appropriate temperature in the electric control box and a temperature reduction of the electric control. Therefore, use safety of the electric control box and the electric control can be ensured.

Also, during the operation of the air conditioner according to the present disclosure, the air in the heat exchange cavity flows into the electric control box, while the fan assembly can continuously supply air to the heat exchange cavity during its operation. As a result, the pressure in the heat exchange cavity is increased to be greater than the pressure in the electric control box and the pressure in the fan cavity. Therefore, in the present disclosure, a volume of air entering the electric control box can be significantly increased to enhance a heat dissipation effect on the electric control box and the electric control in the electric control box. In some embodiments, the present disclosure may provide better heat dissipation effect compared with cooling electric control box by using air from an external environment. In addition, since an airflow driven by the fan assembly has a relatively low temperature, the airflow in the heat exchange cavity can cool down the electric control in the electric control box to a certain extent when flowing through the electric control box, which further reduces a temperature of the electric control, ensuring the service life of the electric control.

Therefore, in the present disclosure, a circulating flow path can be formed inside the air conditioner, to allow an airflow in the fan cavity flowing into the heat exchange cavity to at least partially flow into the electric control box and then flow back to the fan cavity through the electric control box. Therefore, efficient heat dissipation of the electric control box through the partial airflow can be realized, ensuring a service life of each of the electric control box and the electric control.

In some embodiments, the electric control box has a first heat dissipation hole in communication with the heat exchange cavity and a second heat dissipation hole in communication with the fan cavity. After flowing into the heat exchange cavity, an airflow in the fan cavity at least partially flows into the electric control box through the first heat dissipation hole and flows back to the fan cavity through the second heat dissipation hole.

In some possible implementations, the air conditioner further includes a heat dissipation air duct communicating the heat exchange cavity and the electric control box.

In some possible implementations, the air conditioner further includes a mounting beam and a support member. The mounting beam is disposed at a connection between the fan cavity and the heat exchange cavity. The support member is disposed in the heat exchange cavity. The heat dissipation air duct is located between the mounting beam and the support member.

In some possible implementations, the electric control box is located at a lateral side of the fan cavity. The heat dissipation air duct is arranged transversely with respect to an air supply direction of the fan assembly.

In some possible implementations, a spacing is formed between an inlet end of the heat dissipation air duct and an outlet end of the fan cavity. The support member has an arc guide surface located at the inlet end of the heat dissipation air duct.

In some possible implementations, the air conditioner further includes a heat exchanger disposed in the heat exchange cavity. The heat dissipation air duct has an inlet end located at a side of the heat exchanger facing towards the fan assembly. After flowing into the heat exchange cavity, an airflow in the fan cavity at least partially flows into the heat dissipation air duct to exchange heat with the heat exchanger.

In some possible implementations, the housing further includes a pipeline cavity isolated from the heat exchange cavity by the support member. The heat dissipation air duct is located between the pipeline cavity and the electric control box.

In any one of the above implementations, the air conditioner further includes an air guide hood disposed in the fan cavity. The air guide hood is configured to guide an airflow towards the heat exchange cavity.

In any one of the above implementations, the air guide hood has an air supply outlet arranged to face towards the heat exchange cavity. A side wall of the air guide hood has a guide inclined surface located at the air supply outlet. The guide inclined surface extends towards an inlet end of the heat dissipation air duct.

In any one of the above implementations, the air guide hood has an air inlet arranged to face towards an air return inlet of the fan cavity. The electric control box is disposed at a lateral side of the air guide hood and in communication with the fan cavity.

In any one of the above implementations, the fan cavity has an air return inlet. The heat exchange cavity has an air outlet. Air passages are located between the air return inlet and the air outlet. The electric control box is disposed at a lateral side of the air passages and is in communication with some of the air passages in the heat exchange cavity.

In any one of the above implementations, the fan assembly includes a fan wheel disposed in the air duct, and a driver disposed between the fan wheel and the electric control box and connected to the fan wheel.

In any one of the above implementations, the air conditioner further includes a filter disposed at the air return inlet of the fan cavity.

Additional aspects and advantages of the present disclosure will become apparent at least in part from the following description, or can be learned from practicing of the present disclosure.

BRIEF DESCRIPTION OF THE DRAWINGS

The above and/or additional aspects and advantages of the present disclosure will become more apparent and more understandable from the following description of embodiments taken in conjunction with the accompanying drawings, in which.

Figure 1:
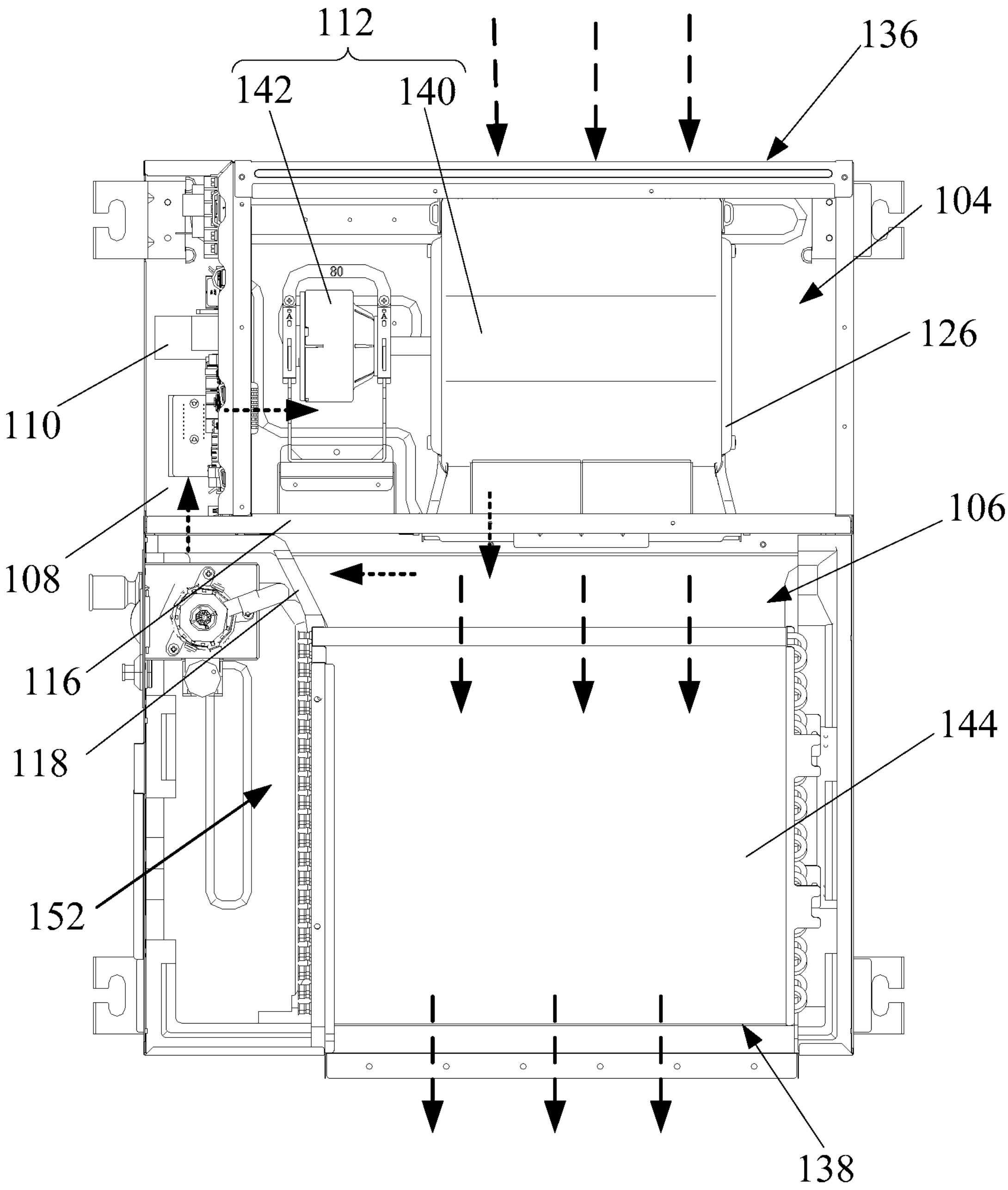
FIG. 1 is a bottom view of an air conditioner according to some embodiments of the present disclosure (with a base plate hidden).

Correspondences between reference numerals in FIG. 1 to FIG. 5 and names of members are as follows:

housing 102; fan cavity 104; heat exchange cavity 106; electric control box 108; electric control 110; fan assembly 112; heat dissipation air duct 114; mounting beam 116; support member 118; first heat dissipation hole 120; arc-shaped guide surface 122; second heat dissipation hole 124; air guide hood 126; air supply outlet 128; side wall 130; guide inclined surface 132; air inlet 134; air return inlet 136; air outlet 138; fan wheel 140; driver 142; heat exchanger 144; filter 146; box body 148; cover body 150; pipeline cavity 152.

DETAILED DESCRIPTION OF THE EMBODIMENTS

In order to clarify and explain the above objectives, features, and advantages of the present disclosure, the present disclosure will be further described in detail below in conjunction with the accompanying drawings and specific embodiments. It should be noted that, the embodiments of the present disclosure and features in the embodiments can be combined with each other without any conflict.

In the following description, many specific details are provided to facilitate full understanding of the present disclosure. However, the present disclosure can further be implemented in other ways different from those described herein. Therefore, the scope of the present disclosure is not limited by specific embodiments disclosed below.

An air conditioner according to some embodiments of the present disclosure will be described below with reference to FIG. 1 to FIG. 5. Dashed arrows in FIG. 1 and FIG. 2 represent an airflow direction.

Figure 2:
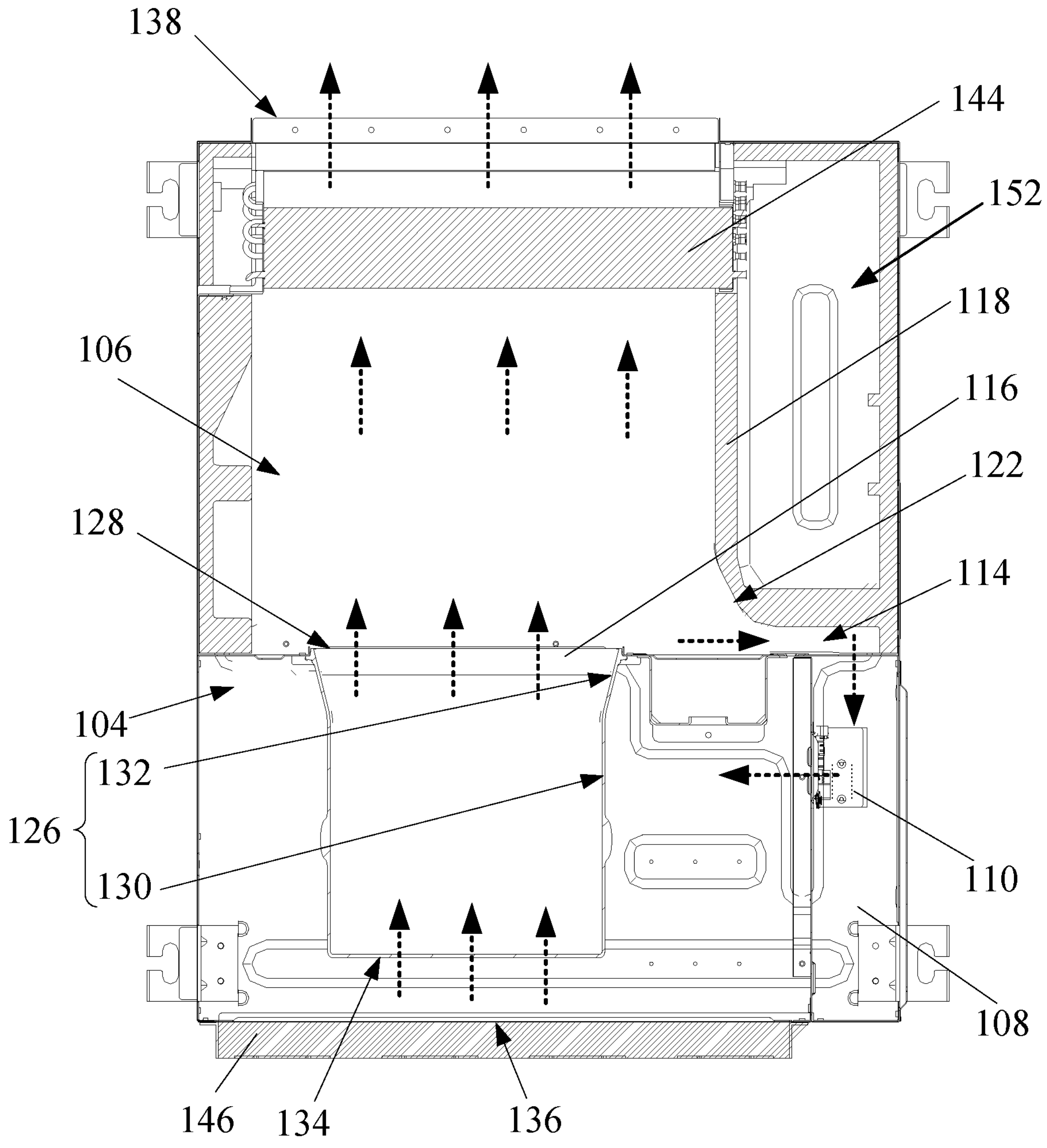
FIG. 2 is a cross-sectional view of an air conditioner according to some embodiments of the present disclosure.
Figure 3:
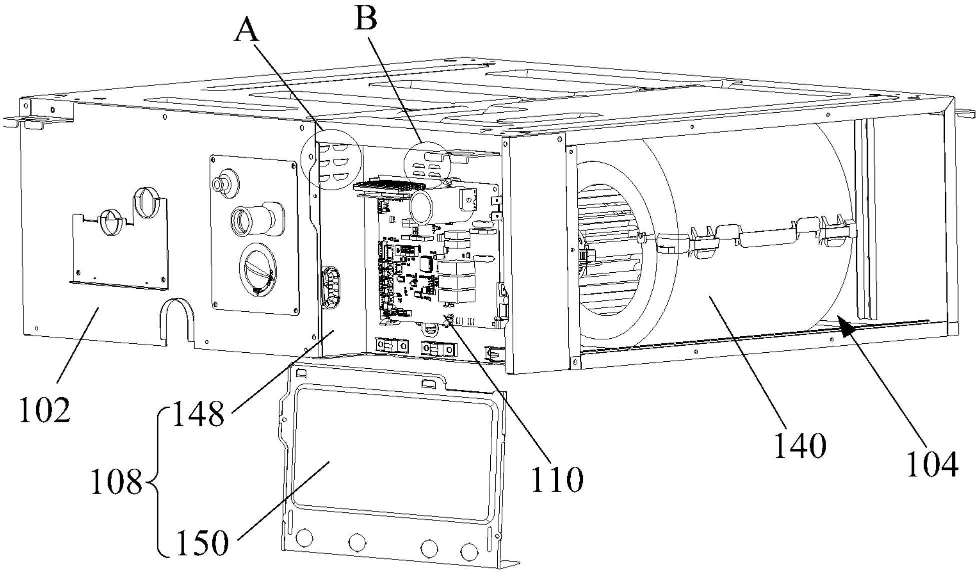
FIG. 3 is a schematic view of a structure of an air conditioner according to some embodiments of the present disclosure.

As illustrated in FIG. 1, FIG. 2, and FIG. 3, according first embodiments of the present disclosure, an air conditioner is provided. The air conditioner includes a housing 102, an electric control box 108, an electric control 110, and a fan assembly 112.

As illustrated in FIG. 1 and FIG. 2, in an air supply direction of the air conditioner, the housing 102 has a fan cavity 104 and a heat exchange cavity 106 in communication with each other. The electric control box 108 is disposed at the housing 102. The electric control box 108 is in communication with a heat exchange cavity 106. The electric control 110 is disposed in the electric control box 108 and can ensure that the whole air conditioner is operated under control. The fan assembly 112 is disposed in the fan cavity 104 and can supply air to the heat exchange cavity 106 during operation.

In some embodiments, as illustrated in FIG. 1 and FIG. 2, the fan assembly 112 is configured to supply the air to the heat exchange cavity 106 during operation, which increase a pressure in the heat exchange cavity 106 to be higher than a pressure in the electric control box 108. As a result, during operation of the air conditioner, due to a pressure difference between the heat exchange cavity 106 and the electric control box 108, an airflow in the heat exchange cavity 106 at least partially flows into the electric control box 108 and then flows back to the fan cavity 104 after flowing through the electric control box 108.

During use of the air conditioner, the electric control 110 will generate heat, and thus a temperature in the electric control box 108 will rise. The high temperature will easily result in damages to the electric control 110 and affect a service life of the electric control 110. Therefore, the airflow flowing through the electric control box 108 can effectively dissipate heat of the electric control box 108 and the electric control 110 in the electric control box 108, which can ensure an appropriate temperature in the electric control box 108 and a temperature reduction of the electric control 110. Therefore, it is possible to ensure use safety of the electric control box 108 and the electric control 110.

Also, during the operation of the air conditioner according to the embodiments of the present disclosure, air in the heat exchange cavity 106 flows into the electric control box 108, while the fan assembly 112 can continuously supply air to the heat exchange cavity 106 during its operation. In this way, the pressure in the heat exchange cavity 106 is greater than the pressure in the electric control box 108 and a pressure in the fan cavity 104. Therefore, in these embodiments, it is possible to significantly increase a volume of air flowing into the electric control box 108 to improve heat dissipation effect on the electric control box 108 and the electric control 110 in the electric control box 108. In some embodiments, heat dissipation effect may be better than cooling by using air from an external environment.

Also, since an airflow driven by the fan assembly 112 has a relatively low temperature, the airflow in the heat exchange cavity 106 can cool the electric control 110 in the electric control box 108 to some extent when entering the electric control box 108, which further lower the temperature of the electric control 110, ensuring the service life of the electric control 110.

Therefore, with the air conditioner according to some embodiments, a circulating flow path can be formed inside the air conditioner to allow an airflow in the fan cavity 104 flowing into the heat exchange cavity 106 to at least partially flow into the electric control box 108 and then flow back to the fan cavity 104 through the electric control box 108, and thus this part of airflow can ensure that the electric control box 108 is in communication with the heat exchange cavity 106. During operation, the pressure in the heat exchange cavity 106 is higher than the pressure in the electric control box 108 and the pressure in the fan cavity 104, which can allow the airflow in the heat exchange cavity 106 to continuously flow through the electric control box 108. Therefore, effective heat dissipation of the electric control box 108 and the electric control 110 can be realized.

According to some embodiments of the present disclosure, an air conditioner is provided.

Figure 4:
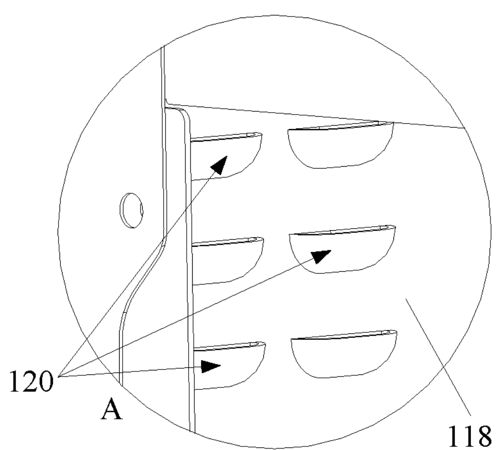
FIG. 4 is an enlarged partial view of part A of the air conditioner illustrated in FIG. 3.
Figure 5:
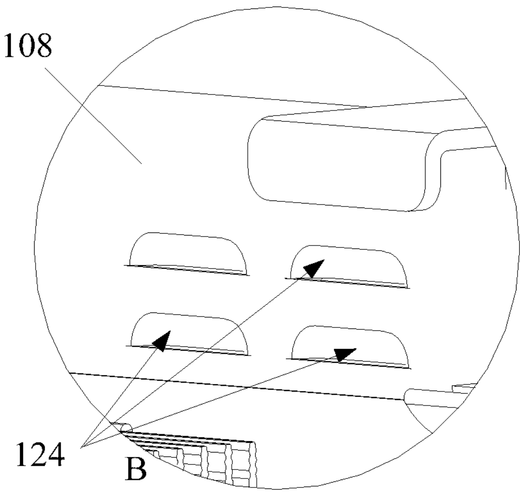
FIG. 5 is an enlarged partial view of part B of the air conditioner illustrated in FIG. 3.

In some embodiments, the electric control box 108 has a first heat dissipation hole 120 and a second heat dissipation hole 124, as illustrated in FIG. 4 and FIG. 5. The first heat dissipation hole 120 is in communication with the heat exchange cavity 106, which ensures that the airflow in the heat exchange cavity 106 can flow into the electric control box 108. The second heat dissipation hole 124 is in communication with the fan cavity 104, which ensures that the airflow in the electric control box 108 can flow into the fan cavity 104. In this way, the circulating flow path can be formed among the fan cavity 104, the heat exchange cavity 106, and an electric control cavity to continuously dissipate heat of the electric control box 108 and the electric control 110 in the electric control box 108 during the operation of the air conditioner.

In some embodiments, during the operation of the air conditioner, the fan assembly 112 continuously supplies air to the heat exchange cavity 106, and thus the pressure in the heat exchange cavity 106 is greater than the pressure in the electric control box 108. In this case, the airflow in the fan cavity 104 continuously flows into the electric control box 108 through the first heat dissipation hole 120. Thereafter, the airflow in the electric control box 108 at least partially continuously flows back to the fan cavity 104 through the second heat dissipation hole 124 to re-participate in the air supply. The airflow flowing back to the fan cavity 104 through the second heat dissipation hole 124 can take away heat in the electric control box 108, which in turn realizes the effective heat dissipation of the electric control box 108 and the electric control 110 in the electric control box 108.

In addition, the air conditioner according to the some embodiments has all the advantageous effects of the air conditioner as described in some embodiments, and can ensure that the airflow in the heat exchange cavity 106 continuously flows into the electric control box 108 during the operation to efficiently dissipating heat of the electric control box 108 and the electric control 110.

According to some embodiments of the present disclosure, an air conditioner is provided.

In some embodiments, the air conditioner further includes a heat dissipation air duct 114, as illustrated in FIG. 2. The heat exchange cavity 106 is in communication with the electric control box 108 through the heat dissipation air duct 114. That is, during operation of the fan assembly, the air in the heat exchange cavity 106 may be driven into the heat dissipation air duct 114 with the pressure difference, and flow into the electric control box 108 through the heat dissipation air duct 114, realizing the efficient heat dissipation of the electric control box 108 and the electric control box 108.

In some embodiments, due to the above heat dissipation air duct 114, the communication between the heat exchange cavity 106 and the electric control box 108 can be (e.g., greatly) improved, and the volume of air flowing into the electric control box 108 per unit of time can be ensured during the operation of the air conditioner, ensuring the heat dissipation effect on the electric control box 108 and the electric control 110 in the electric control box 108.

Also, due to the above heat dissipation air duct 114, a requirement for a relative position between the heat exchange cavity 106 and the electric control box 108 is lowered, allowing for more flexible mounting of the electric control box 108. The mounting of the electric control box 108 is achievable as long as the electric control box 108 can be arranged at a connection between the electric control box 108 and the heat dissipation air duct 114.

In addition, an inlet end of the heat dissipation air duct 114 is located at a connection between the fan cavity 104 and the heat exchange cavity 106, to ensure that the inlet end of the heat dissipation air duct 114 is at a distance from a heat exchanger 144 in the heat exchange cavity 106. As a result, it is possible to ensure low humidity of the air flowing into the electric control box 108. Therefore, an accumulation of moisture in the electric control box 108 can be avoided to ensure dry air in the electric control box 108. Thus, service life of each of the electric control box 108 and the electric control 110 can be ensured.

In some embodiments, as illustrated in FIG. 1 and FIG. 2, the air conditioner further includes a mounting beam 116 and a support member 118. The mounting beam 116 is disposed at a middle part of the housing 102, and is located at a connection between the fan cavity 104 and the heat exchange cavity 106. The mounting beam 116 may be used as a cross beam. The support member 118 is disposed in the heat exchange cavity 106, and may abut with an interior of the housing 102 to ensure strength and hardness of the housing 102 itself, avoiding a dent in the housing 102 due to a collision during transportation and use of the air conditioner.

In some embodiments, as illustrated in FIG. 2, it is possible to ensure that there is a predetermined space between the mounting beam 116 and the support member 118. The space between the mounting beam 116 and the support member 118 can be directly formed as the heat dissipation air duct 114. In this way, on the one hand, the inlet end of the heat dissipation air duct 114 can be ensured to be in communication with the connection between the fan cavity 104 and the heat exchange cavity 106. On the other hand, an additional design of the heat dissipation air duct 114 can be omitted to greatly simplify a structure of the heat dissipation air duct 114 and the whole air conditioner while lowering a weight of the air conditioner.

Therefore in some embodiments, the relative position between the mounting beam 116 and the support member 118 is suitably designed. In this way, the heat dissipation air duct 114 can be formed directly by the space between the mounting beam 116 and the support member 118, which is conducive to simplifying the structure of the air conditioner while facilitating design, manufacturing, and assembly of the heat exchanger 144. Further, it is possible to contribute to a cost reduction of the heat exchanger 144. In addition, the mounting beam 116 has a communication opening configured to be in communication with the heat dissipation air duct 114 and the heat exchange cavity 106.

In some embodiments, the support member 118 may be made of support foam to further lower the weight of the air conditioner.

In addition, the mounting beam 116 has the communication opening configured to be in communication with the heat dissipation air duct 114 and the heat exchange cavity 106. In some embodiments, as illustrated in FIG. 4, the mounting beam 116 may be provided with a plurality of flanges to allow the communication openings to be formed at the flanges. In addition, one or more communication openings may be formed, and are designed based on an air volume required for actual heat dissipation of the electric control box 108. Also, a shape of the communication opening may be designed as desired, which may be a circular shape, an oval shape, a triangular shape, a rectangular shape, or other irregular shapes. Further, the aforementioned contents are understandable by those skilled in the art.

In addition, the air conditioner according to some embodiments has all the advantageous effects of the air conditioner, and can ensure that the airflow in the heat exchange cavity 106 continuously flows into the electric control box 108 during the operation, efficiently dissipating heat of the electric control box 108 and the electric control 110.

According to fourth embodiments of the present disclosure, an air conditioner is provided.

In some embodiments, as illustrated in FIG. 1 and FIG. 2, in the air supply direction of the air conditioner, the electric control box 108 is located at a lateral side of the fan cavity 104, and the heat dissipation air duct 114 is arranged transversely with respect to an air supply direction of the fan assembly 112. In this way, in some embodiments, by reasonably arranging the relative positions of the electric control box 108 and the fan cavity 104, it is possible ensures that the electric control box 108 exerts no influence on an air supply of the fan assembly 112 in the fan cavity 104 while ensuring that no interference occurs between the electric control box 108 and the fan cavity 104.

In addition, the heat dissipation air duct 114 is arranged transversely with respect to the air supply direction of the fan assembly 112 and extends towards the electric control box 108. As a result, it is possible to ensure that the airflow in the heat exchange cavity 106 can flow into the electric control box 108 to dissipate heat of the electric control box 108 and the electric control 110 in the electric control box 108.

In some embodiments, spacing is formed between the inlet end of the heat dissipation air duct 114 and an outlet end of the fan cavity 104, to ensure a buffer space between the inlet end of the heat dissipation air duct 114 and the outlet end of the fan cavity 104. In addition, in some embodiments, a structure of the support member 118 is optimized to allow the mounting beam 116 to have an arc-shaped guide surface 122 located at the inlet end of the heat dissipation air duct 114.

In some embodiments, as illustrated in FIG. 1 and FIG. 2, due to the arc-shaped guide surface 122, it is possible to prevent the support member 118 from forming a tip at the inlet end of the heat dissipation air duct 114, and to reduce an air resistance of the support member 118 at the inlet end of the heat dissipation air duct 114, providing good guiding effect at the inlet end of the heat dissipation air duct 114 by the arc-shaped guide surface 122. That is, during the operation of the air conditioner, the air in the heat exchange cavity 106 is in contact with the arc-shaped guide surface 122 at the inlet end of the heat dissipation air duct 114, and smoothly flows into the heat dissipation air duct under the guiding of the arc-shaped guide surface 122. Therefore, a volume of air entering the heat dissipation air duct 114 per unit of time, can be increased, to enhance the heat dissipation effect on the electric control box 108. Therefore, the efficient heat dissipation of the electric control box 108 and the electric control 110 can be realized.

In addition, the air conditioner according to some embodiments has all the advantageous effects of the air conditioner as described in some embodiments, and can ensure that the airflow in the heat exchange cavity 106 continuously flows into the electric control box 108 during the operation, efficiently dissipating heat of the electric control box 108 and the electric control 110.

In some embodiments, the air conditioner further includes a heat exchanger 144. The heat exchanger 144 is disposed in the fan cavity 104, and can be in contact with the airflow in the heat exchange cavity 106 to and exchange heat with the airflow during the operation of the air conditioner, realizing a cooling capability and a heating capability of the air conditioner.

In some embodiments, as illustrated in FIG. 1 and FIG. 2, a connection between the electric control box 108 and the fan cavity 104 is located at a side of the heat exchanger 144 facing towards the fan cavity 104. That is, it is ensured that the inlet end of the heat dissipation air duct 114 is located at the side of the heat exchanger 144 facing towards the fan cavity 104. During the operation of the air conditioner, since air located at the side of the heat exchanger 144 facing towards the fan cavity 104 has not yet been in contact with the heat exchanger 144 to exchanged heat with the heat exchanger 144, this air has low water vapor content. Therefore, when this air flows into the electric control box 108, an accumulation of moisture in the electric control box 108 can be avoided to ensure that the air in the electric control box 108 is dry, which in turn ensures the service life of each of the electric control box 108 and the electric control 110.

In some embodiments, as illustrated in FIG. 1 and FIG. 2, the heat exchanger 144 is obliquely disposed in the heat exchanger 144. Also, it is ensured that the side of the heat exchanger 144 facing towards the fan cavity 104 is positioned at higher level. In this way, a sufficient distance between the inlet end of the heat dissipation air duct 114 and the heat exchanger 144 can be ensured. That is, it is ensured that there is the sufficient distance between the inlet end of the heat dissipation air duct 114 and the heat exchanger 144, which can ensure the low humidity of the air flowing into the electric control box 108. Therefore, it is possible to ensure that the electric control box 108 and the electric control 110 are free from damages such as corrosion due to moisture.

In some embodiments, the housing 102 further has a pipeline cavity 152. An end portion of a refrigerant pipeline of the heat exchanger is located in the pipeline cavity 152 and can be in communication with an external pipe in a refrigerant cavity to ensure an input and an output of a refrigerant. In addition, the pipeline cavity 152 is isolated from the heat exchange cavity 106 by the support member 118. Sealing of the pipeline cavity 152 is ensured by the support member 118. The heat dissipation air duct 114 is located between the pipeline cavity 152 and the electric control box 108. In this way, by isolating the pipeline cavity 152 from the heat exchange cavity 106 by the support member 118, it is possible to ensure the sealing of the pipeline cavity 152, which in turn avoids generation of condensation in the pipeline cavity 152. Further, since the heat dissipation air duct 114 is located between the pipeline cavity 152 and the electric control box 108, it is possible to ensure the heat dissipation air duct 114 is isolated from the pipeline cavity 152 by the support member 118 while the airflow in the heat dissipation air duct 114 can be prevented from flowing into the pipeline cavity 152. As a result, the generation of the condensation in the pipeline cavity 152 can be avoided.

In addition, the air conditioner according to some embodiments has all the advantageous effects of the air conditioner, and can ensure that the airflow in the heat exchange cavity 106 continuously flows into the electric control box 108 during the operation, efficiently dissipating heat of the electric control box 108 and the electric control 110.

In some embodiments, the air conditioner further includes an air guide hood 126, as illustrated in FIG. 1 and FIG. 2. The air guide hood 126 is disposed in the fan cavity 104, and can provide good air guidance during operation of the fan assembly 112, to guide an airflow generated by the fan assembly 112 to the heat exchange cavity 106.

In some embodiments, as illustrated in FIG. 2, the air guide hood 126 has an air supply outlet 128. The air supply outlet 128 is designed to face towards the heat exchange cavity 106. In addition, a side wall 130 of the air guide hood 126 has a guide inclined surface 132 located at the air supply outlet 128. As a result, the air supply outlet 128 has a flared shape. Also, the guide inclined surface 132 extends towards the connection between the heat exchange cavity 106 and the electric control box 108.

In this way, during an operation of the air conditioner, as illustrated in FIG. 2, the airflow generated by the fan assembly 112 can be diffused when flowing out of the air supply outlet 128, to allow the airflow to at least partially flow towards the connection between the heat exchange cavity 106 and the electric control box 108. That is, it is possible to allow the airflow to at least partially flow towards the inlet end of the heat dissipation air duct 114, which is conducive to increasing the volume of air flowing into the electric control box 108 per unit of time, which in turn improves the heat dissipation effect on the electric control box 108.

It should be particularly noted that the operation of the fan assembly 112 can supply air to the heat exchange cavity 106. An accumulation of the air in the heat exchange cavity 106 will lead to a high pressure in the heat exchange cavity 106. In this case, the air in the heat exchange cavity 106 may flow into the electric control box 108. In some embodiments, by arranging the guide inclined surface 132 on this basis, the airflow supplied by the fan assembly 112 can directly flow towards the connection between the heat exchange cavity 106 and the electric control box 108, which further improves the heat dissipation effect on the electric control box 108.

Further, in some embodiments, as illustrated in FIG. 2, the air guide hood 126 has an air inlet 134. The air inlet 134 and the air supply outlet 128 are opposite to each other. The air inlet 134 is arranged towards an air return inlet 136 of the housing 102, and can be configured to suck the air from an external environment. In addition, the electric control box 108 is disposed at a lateral side of the air guide hood 126. The heat dissipation air duct 114 is arranged transversely. In this way, the airflow generated by the fan assembly 112 can be at least partially directly guided to the connection between the heat exchange cavity 106 and the electric control box 108.

In addition, in some embodiments, the air conditioner can ensure that the airflow in the heat exchange cavity 106 continuously flows into the electric control box 108 during the operation, efficiently dissipating heat of the electric control box 108 and the electric control 110.

In some embodiments, the fan cavity 104 has the air return inlet 136, and the heat exchange cavity 106 has an air outlet 138, as illustrated in FIG. 1 and FIG. 2. Air passages (not illustrated) of the air conditioner are located between the air return inlet 136 and the air outlet 138. During the operation of the air conditioner, external air may flow into the air passages through the air return inlet 136. The airflow is driven by the fan assembly 112 into the heat exchange cavity 106 and is discharged through the air outlet 138. In some embodiments, the electric control box 108 is disposed at a lateral side of the air passages. Further, the electric control box 108 is in communication with some of the air passages located in the heat exchange cavity 106. In this way, it is possible to ensure the air in the air passages can be driven by the pressure difference to flow into the electric control box 108, realizing cooling of the electric control box 108.

Further, in some embodiments, as illustrated in FIG. 1 and FIG. 2, the fan assembly 112 includes a fan wheel 140 and a driver 142 connected to each other. The fan wheel 140 and the fan assembly 112 are both disposed in the fan cavity 104. In addition, it is ensured that the fan wheel 140 is disposed in the air duct and the driver 142 is disposed between the fan wheel 140 and the electric control box 108. In this way, during an operation of the fan assembly 112, the driver 142 drives the fan wheel 140 to rotate in the air duct, to allow the fan wheel 140 to supply air to the heat exchange cavity 106. In this case, the pressure in the heat exchange cavity 106 is higher, while the pressure in the electric control box 108 is lower, which in turn allow the airflow in the heat exchange cavity 106 to be driven with the pressure difference to flow into the electric control box 108, realizing the efficient heat dissipation of the electric control box 108.

In some embodiments, the driver 142 is a motor, and the electric control box 108 includes a motor drive module. The motor drive module is electrically connected to the motor and is configured to control an operation of the motor.

Further, in a case where the electric control box 108 is in communication with the fan cavity 104, the electric control box 108 is in communication with a position at which the driver 142 is located and is in communication with an exterior of the air passages (since some of the air passages are located in the air guide hood 126). In this case, a pressure at a position where the driver 142 is located is low, which in turn ensures that the air in the electric control box 108 can flow into the fan cavity 104.

In addition, the air conditioner in some embodiments can ensure that the airflow in the heat exchange cavity 106 continuously flows into the electric control box 108 during the operation, efficiently dissipating heat of the electric control box 108 and the electric control 110.

In some embodiments, the air conditioner further includes a filter 146, as illustrated in FIG. 2. The filter 146 is disposed at the air return inlet 136 of the fan cavity 104 and is connected to the housing 102. In this way, during the operation of the air conditioner, the filter 146 can provide good filtration to foreign materials mixed in the air, which in turn ensures cleanliness of the air flowing into the housing 102, and further ensures cleanliness of the air flowing into the electric control box 108.

In some embodiments, the electric control 110 in the electric control box 108 is generally a precision element having a high price. In some embodiments, in the case where heat of the electric control box 108 and the electric control 110 is dissipated by using the air in the heat exchange cavity 106, by arranging the filter 146 at the air return inlet 136 of the air conditioner, it is possible to effectively reduce or prevent dust from entering the electric control box 108, which can ensure the cleanliness of the electric control box 108 and the service life of the electric control 110.

In some embodiments, the filter 146 may be a filter mesh. In addition, the filter 146 is removably mounted at the air return inlet 136 for ease of replacement, maintenance, and cleaning by a user.

In any one of the above embodiments, in the case where the electric control box 108 is in communication with the heat exchange cavity 106, the electric control box 108 may further be in communication with the fan cavity 104 or the external environment, or with both the fan cavity 104 and the external environment. Further, the description of communications of the electric control box 108 will be provided below respectively.

In one communication, as illustrated in FIG. 5, the electric control box 108 is in communication with the fan cavity 104 and the heat exchange cavity 106. In this way, the fan assembly 112 can supply air to the heat exchange cavity 106 during its operation, which increases the pressure in the heat exchange cavity 106 to be higher than the pressure in the electric control box 108 and the pressure in the fan cavity 104. In this case, with the driving of the pressure difference, the air in the heat exchange cavity 106 flows into the electric control box 108, and then the air in the electric control box 108 can flow into the fan cavity 104, forming a heat dissipation flow path. In this way, the airflow flowing into the electric control box 108 can effectively dissipate heat of the electric control box 108 and the electric control 110 in the electric control box 108. In addition, when the air in the electric control box 108 flows into the fan cavity 104, the air can also carry the heat in the electric control box 108 to the fan cavity 104, which further dissipates heat of the electric control box 108. Therefore, the heat dissipation effect on the electric control box 108 can be greatly improved.

In addition, as illustrated in FIG. 5, in the case where the electric control box 108 is in communication with the fan cavity 104 and the heat exchange cavity 106, the electric control box 108 has a first heat dissipation hole 120 and a second heat dissipation hole 124. The electric control box 108 is in communication with the heat exchange cavity 106 through the first heat dissipation hole 120. Further, the electric control box 108 is in communication with the fan cavity 104 through the second heat dissipation hole 124. Also, the air flowing into the fan cavity 104 may be blown towards the heat exchange cavity 106 again. This air may be blown out after a heat exchange, or may further cool the electric control box 108.

In another communication, the electric control box 108 is in communication with the heat exchange cavity 106 and the external environment. In this way, the fan assembly 112 can supply air to the heat exchange cavity 106 during its operation, which increases the pressure in the heat exchange cavity 106 to be higher than the pressure in the electric control box 108 and a pressure in the external environment. In this case, with the driving of the pressure difference, the air in the heat exchange cavity 106 flows into the electric control box 108, and then the air in the electric control box 108 may flow into the external environment, forming an air flow path. In this way, the airflow flowing into the electric control box 108 can effectively dissipate heat of the electric control box 108 and the electric control 110 in the electric control box 108. In addition, when the air in the electric control box 108 flows into the external environment, the air can also carry the heat in the electric control box 108 to the external environment, which further dissipates heat of the electric control box 108 Therefore, the heat dissipation effect on the electric control box 108 can be greatly improved.

In addition, in the case where the electric control box 108 is in communication with the heat exchange cavity 106 and the external environment, the electric control box 108 has the first heat dissipation hole 120 and a third heat dissipation hole. The electric control box 108 is in communication with the heat exchange cavity 106 through the first heat dissipation hole 120. Further, the electric control box 108 is in communication with the external environment through the third heat dissipation hole. Also, this air no longer participates in heat dissipation of the electric control box 108.

In further another communication, the electric control box 108 is in communication with the heat exchange cavity 106, the fan cavity 104, and the external environment. In this way, the fan assembly 112 can supply air to the heat exchange cavity 106 during its operation, which increase the pressure in the heat exchange cavity 106 to be higher than all the pressure in the electric control box 108 and the pressure in the fan cavity 104, and the pressure in the external environment. In this case, with the driving of the pressure difference, the air in the heat exchange cavity 106 flows into the electric control box 108, and then the air in the electric control box 108 can flow into the fan cavity 104 and the external environment, forming two branches. In this way, the airflow flowing into the electric control box 108 can effectively dissipate heat of the electric control box 108 and the electric control 110 in the electric control box 108. In addition, when the air in the electric control box 108 flows into the fan cavity 104 and the external environment, the air can also carry the heat in the electric control box 108 to the external environment, which further dissipates heat of the electric control box 108. Therefore, the heat dissipation effect on the electric control box 108 can be greatly improved.

In addition, the electric control box 108 has the first heat dissipation hole 120, the second heat dissipation hole 124, and the third heat dissipation hole. The electric control box 108 is in communication with the heat exchange cavity 106 through the first heat dissipation hole 120. Further, the electric control box 108 is in communication with the fan cavity 104 through the second heat dissipation hole 124. Furthermore, the electric control box 108 is in communication with the external environment through the third heat dissipation hole. In addition, this air no longer participates in the heat dissipation of the electric control box 108. Also, the air flowing into the fan cavity 104 may be blown towards the heat exchange cavity 106 again. This air may be blown out after a heat exchange, or may further cool the electric control box 108. A part of the air flowing into the external environment no longer participates in the heat dissipation of the electric control box 108.

In some embodiments, when the electric control box 108 is in communication with the fan cavity 104, since the fan assembly 112 is disposed in the fan cavity 104, the fan assembly 112 can further lower the pressure in the fan cavity 104 during its operation. In this way, the pressure in the fan cavity 104 is lower than the pressure in the electric control box 108, which further drives the air in the electric control box 108 to flow into the fan cavity 104, further improving the heat dissipation efficiency of the electric control box 108.

In some embodiments, as illustrated in FIG. 5, the electric control box 108 may be provided with a plurality of flanges, and the first heat dissipation holes 120 is formed at the flanges. In addition, one or more first heat dissipation holes 120 may be formed, and may be designed based on the volume of the air required for the actual heat dissipation of the electric control box 108. More first heat dissipation holes 120 may be designed when a higher volume of the air is required to dissipate heat of the electric control box 108. Also, a shape of the first heat dissipation hole 120 may be designed as desired. The first heat dissipation hole 120 may be in a circular shape, an oval shape, a triangular shape, a rectangular shape, or other irregular shapes. Further, the aforementioned disclosures are understandable by those skilled in the art.

In some embodiments, the electric control box 108 may be provided with a plurality of flanges, and the second heat dissipation holes 124 is formed at the flanges. In addition, one or more second heat dissipation holes 124 may be formed, and may be designed based on the volume of the air required for the actual heat dissipation of the electric control box 108. More second heat dissipation holes 124 may be designed when a higher volume of the air is required to dissipate heat of the electric control box 108. Also, a shape of the second heat dissipation hole 124 may be designed as desired. The second heat dissipation hole 124 may be in a circular shape, an oval shape, a triangular shape, a rectangular shape, or other irregular shapes. Further, the aforementioned disclosures are understandable by those skilled in the art.

In some embodiments, the electric control box 108 may be provided with a plurality of flanges, and the third heat dissipation holes is formed at the flanges. In addition, one or more third heat dissipation holes may be formed, and may be designed based on the volume of the air required for the actual heat dissipation of the electric control box 108. More third heat dissipation holes may be designed when a higher volume of the air is required to dissipate heat of the electric control box 108. Also, a shape of the third heat dissipation hole may be designed as desired. The third heat dissipation hole may be in a circular shape, an oval shape, a triangular shape, a rectangular shape, or other irregular shapes. Further, the aforementioned disclosures are understandable by those skilled in the art.

In any one of the above embodiments, the electric control 110 includes the motor drive module, and is configured to drive a motor of the air conditioner to operate. In some embodiments, the motor drive module generates heat during driving the motor to operate. If the motor drive module is designed together with the motor, costs of the whole motor will be high. Therefore, in the present disclosure, the motor drive module is disposed in the electric control box 108 and heat is dissipated through the airflow in the heat exchange cavity 106. In this way, a heat dissipation demand of each of the motor drive module and the electric control box 108 can be addressed while reducing costs of each of the motor and the air conditioner.

In any one of the above embodiments, as illustrated in FIG. 3, the electric control box 108 includes a box body 148 and a cover body 150. The box body 148 and the housing 102 may be integrally formed. The cover body 150 is arranged to cover the box body 148.

In some embodiments, the air conditioner includes a housing 102, an electric control box 108, an electric control 110, and a fan assembly 112. The fan assembly 112 is configured to supply air to a heat exchange cavity 106 during its operation, which increases a pressure in the heat exchange cavity 106 to be higher than a pressure in the electric control box 108. Therefore, during an operation of the air conditioner, due to a pressure difference between the heat exchange cavity 106 and the electric control box 108, an airflow in the heat exchange cavity 106 at least partially flows into the electric control box 108 and flows back to the fan cavity 104 after flowing through the electric control box 108. The airflow flowing through the electric control box 108 can effectively dissipate heat of the electric control box 108 and the electric control 110 in the electric control box 108, therefore, it is possible to ensure an appropriate temperature in the electric control box 108 and a temperature reduction of the electric control 110, to ensure the use safety of the electric control box 108 and the electric control 110.

Further, in some embodiments, the electric control box 108 has a first heat dissipation hole 120 and a second heat dissipation hole 124. The first heat dissipation hole 120 is in communication with the heat exchange cavity 106, which ensures that the airflow in the heat exchange cavity 106 can flow into the electric control box 108. The second heat dissipation hole 124 is in communication with the fan cavity 104, which ensures that the airflow in the electric control box 108 can flow into the fan cavity 104.

Further, in the embodiments, the air conditioner further includes a heat dissipation air duct 114. The heat exchange cavity 106 is in communication with the electric control box 108 through the heat dissipation air duct 114. In some embodiments, an inlet end of the heat dissipation air duct 114 is located at a connection between the fan cavity 104 and the heat exchange cavity 106. In this way, it is possible to ensure that the inlet end of the heat dissipation air duct 114 is at a distance from the heat exchanger 144 in the heat exchange cavity 106. In addition, the air conditioner further includes a mounting beam 116 and a support member 118. There is a predetermined space between the mounting beam 116 and the support member 118. The space between the mounting beam 116 and the support member 118 is directly formed as the heat dissipation air duct 114. Further, in an air supply direction of the air conditioner, the electric control box 108 is located at a lateral side of the fan cavity 104. The heat dissipation air duct 114 is arranged transversely with respect to the air supply direction of the fan assembly 112. Also, a spacing is formed between the inlet end of the heat dissipation air duct 114 and the outlet end of the fan cavity 104. The mounting beam 116 has an arc-shaped guide surface 122 located at the inlet end of the heat dissipation air duct 114.

Further, in some embodiments, the air conditioner further includes a heat exchanger 144. The heat exchanger 144 is disposed in the fan cavity 104. The connection between the electric control box 108 and the fan cavity 104 is located at a side of the heat exchanger 144 facing towards the fan cavity 104. During the operation of the air conditioner, the air located at the side of the heat exchanger 144 facing towards the fan cavity 104 has not yet been in contact with the heat exchanger 144 to exchange heat with the heat exchanger 144. When this airflow flows into the electric control box 108, an accumulation of moisture in the electric control box 108 can be avoided to ensure that the air in the electric control box 108 is dry, which in turn ensures the service life of each of the electric control box 108 and the electric control 110. In addition, the housing 102 further has a pipeline cavity 152. An end portion of a refrigerant pipeline of the heat exchanger is located in the pipeline cavity 152 and may be in communication with an external pipe in the refrigerant cavity to ensure an input and an output of the refrigerant. In addition, the pipeline cavity 152 is isolated from the heat exchange cavity 106 by the support member 118.

In some embodiments, the air conditioner further includes an air guide hood 126. The air guide hood 126 has an air supply outlet 128. A side wall 130 of the air guide hood 126 has a guide inclined surface 132 located at the air supply outlet 128. As a result, the air supply outlet 128 has a flared shape. Further, the air guide hood 126 has an air inlet 134. The air inlet 134 and the air supply outlet 128 are opposite each other. The air inlet 134 faces towards the air return inlet 136 of the housing 102. The electric control box 108 is disposed at a lateral side of the air guide hood 126. The heat dissipation air duct 114 is arranged transversely. In addition, the fan cavity 104 has an air return inlet 136, and the heat exchange cavity 106 has an air outlet 138. Air passages of the air conditioner are located between the air return inlet 136 and the air outlet 138. The electric control box 108 is disposed at a lateral side of the air passages. In addition, the fan assembly 112 includes a fan wheel 140 and a driver 142 connected to each other.

In some embodiments, the air conditioner further includes a filter 146. The filter 146 is disposed at the air return inlet 136 of the fan cavity 104 and is connected to the housing 102. The filter 146 can provide good filtration to foreign material mixed in the air, which ensures the cleanliness of the air flowing into the housing 102, and further ensures the cleanliness of the air flowing into the electric control box 108.

In some embodiments, electric controls such as the motor drive module will generate heat during use. In the related art, heat dissipation members such as an aluminum member are disposed in the electric control box. However, the heat dissipation efficiency is low, which fails to effectively address the heat dissipation demand of each of the electric control and the electric control box, easily resulting in damages to the electric controls. The air conditioner according to the embodiments of the present disclosure can effectively address the heat dissipation demand of the electric control 110 such as the motor drive module, and can realize interior dust-proof and moisture-proof of the electric control box 108.

With the air conditioner according to the embodiments of the present disclosure, as illustrated in FIG. 1, FIG. 2, and FIG. 3, the heat dissipation air duct 114 is formed between the support member 118 and the mounting beam 116. The heat dissipation air duct 114 is configured to communicate the heat exchange cavity 106 and the electric control box 108. During the operation of the air conditioner, since the fan assembly 112 continuously supplies air to the heat exchange cavity 106, an air pressure in the heat exchange cavity 106 is relatively high, while an air pressure in each of the fan cavity 104 where the fan assembly 112 is located, an interior of the electric control box 108, and the external environment is relatively low. Therefore, the air in the heat exchange cavity 106 will flow into the fan cavity 104 to enhance the heat dissipation of the electric control box 108 and the electric control 110.

In addition, as illustrated in FIG. 5, the first heat dissipation hole 120 may be formed at a side of the electric control box 108 facing towards the heat exchange cavity 106 to ensure that the airflow in the heat exchange cavity 106 flows into the electric control box 108 through the first heat dissipation hole 120. The second heat dissipation hole 124 may be formed at a side of the electric control box 108 facing towards the fan cavity 104, to ensure that the airflow in the electric control box 108 flows back to the fan cavity 104 through the second heat dissipation hole 124, and takes away the heat in the electric control box 108. Thus, the heat dissipation effect on the electric control box 108 and the electric control 110 can be further enhanced.

In addition, the third heat dissipation hole may be further formed at the electric control box 108 to ensure that the airflow in the electric control box 108 flows into the external environment through the third heat dissipation hole. In this case, the air in the electric control box 108 may further flow to the external environment and take away the heat in the electric control box 108. Therefore, the heat dissipation effect on the electric control box 108 and the electric control 110 can be further enhanced.

In addition, as illustrated in FIG. 2, the filter 146 is disposed at the air return inlet 136 of the fan cavity 104. In this way, the air flowing into an interior of the air conditioner has a low content of the foreign materials, which can ensure the cleanliness of the air flowing into the housing 102, and further ensures the cleanliness of the air flowing into the electric control box 108.

In addition, as illustrated in FIG. 1 and FIG. 2, the heat exchanger 144 is disposed in the fan cavity 104. Also, the inlet end of the heat dissipation air duct 114 is ensured to be located at the side of the heat exchanger 144 facing towards the fan cavity 104. In this way, the air flowing into the heat dissipation air duct 114 and the electric control box 108 exchanges no heat with the heat exchanger 144. Therefore, the water vapor content in this air is low, which can avoid the accumulation of the moisture in the electric control box 108. As a result, it is possible to ensure that the air in the electric control box 108 is dry, further ensuring the service life of each of the electric control box 108 and the electric control 110.

In the description of the present disclosure, the term "a plurality of" means two or more, unless otherwise specified defined. The orientation or the position indicated by terms such as "on" and "below" refer to the orientation or the position as shown in the drawings, and is only for the convenience of describing the present disclosure and simplifying the description, rather than indicating or implying that the pointed device or element must have a specific orientation, or be constructed and operated in a specific orientation, and therefore cannot be understood as a limitation of the present disclosure. Terms such as "connect," "install," "fix" and the like should be understood in a broad sense. For example, it may be a fixed connection or a detachable connection or connection as one piece; or a direct connection or indirect connection through an intermediate. For those skilled in the art, the specific meaning of the above-mentioned terms in the present disclosure can be understood according to specific circumstances.

In the description of the present disclosure, description of terms such as "an embodiment," "some embodiments," and "a specific embodiment" means that specific features, structures, materials, or characteristics described in conjunction with the embodiment or example are included in at least one embodiment or example of the present disclosure. In this specification, the schematic representations of the above terms do not necessarily refer to the same embodiment or example. Moreover, the described specific features, structures, materials, or characteristics may be combined in any one or more embodiments or examples in a suitable manner.

While some embodiments of the present disclosure have been described above, the present disclosure is not limited to these embodiments. For those skilled in the art, various changes and variations can be made to the present disclosure. Any modification, equivalent substitution, improvement, etc., made within the spirit and principles of the present disclosure shall fall within the scope of the present disclosure.

What is claimed is:

1. An air conditioner, comprising:
- a housing having a fan cavity and a heat exchange cavity in communication with each other;
- an electric control box disposed at the housing and in communication with the heat exchange cavity and the fan cavity;
- an electric control disposed in the electric control box; and
- a fan assembly disposed in the fan cavity, the fan assembly being configured to supply air to the heat exchange cavity and dissipate heat of the electric control box, wherein the electric control box has a first heat dissipation hole in communication with the heat exchange cavity and a second heat dissipation hole in communication with the fan cavity; and
- after flowing into the heat exchange cavity, an airflow in the fan cavity at least partially flows into the electric control box through the first heat dissipation hole and flows back to the fan cavity through the second heat dissipation hole.

2. The air conditioner according to claim 1, wherein:
- the fan cavity has an air return inlet;
- the heat exchange cavity has an air outlet, air passages being located between the air return inlet and the air outlet; and
- the electric control box is disposed at a lateral side of the air passages and is in communication with some of the air passages in the heat exchange cavity.

3. The air conditioner according to claim 2, wherein the fan assembly comprises:
- a fan wheel disposed in a heat dissipation air duct; and
- a driver disposed between the fan wheel and the electric control box and connected to fan wheel.

4. The air conditioner according to claim 1, wherein a plurality of flanges is disposed on the electric control box and the first heat dissipation hole are formed at the flanges.

5. The air conditioner according to claim 1, wherein:
- the fan cavity has an air return inlet;
- the heat exchange cavity has an air outlet, air passages being located between the air return inlet and the air outlet; and
- the electric control box is disposed at a lateral side of the air passages and is in communication with some of the air passages in the heat exchange cavity.

6. The air conditioner according to claim 1, further comprising a filter disposed at an air return inlet of the fan cavity.

7. An air conditioner, comprising:
- a housing having a fan cavity and a heat exchange cavity in communication with each other;
- an electric control box disposed at the housing and in communication with the heat exchange cavity and the fan cavity;
- an electric control disposed in the electric control box;
- a fan assembly disposed in the fan cavity, the fan assembly being configured to supply air to the heat exchange cavity and dissipate heat of the electric control box; and
- a heat dissipation air duct communicating the heat exchange cavity and the electric control box.

8. The air conditioner according to claim 7, further comprising:
- a mounting beam disposed at a connection between the fan cavity and the heat exchange cavity; and
- a support member disposed in the heat exchange cavity, the heat dissipation air duct being located between the mounting beam and the support member.

9. The air conditioner according to claim 7, wherein:
- the electric control box is located at a lateral side of the fan cavity; and
- the heat dissipation air duct is arranged transversely with respect to an air supply direction of the fan assembly.

10. The air conditioner according to claim 8, wherein:
- a spacing is formed between an inlet end of the heat dissipation air duct and an outlet end of the fan cavity; and
- the support member has an arc-shaped guide surface located at the inlet end of the heat dissipation air duct.

11. The air conditioner according to claim 8, further comprising a heat exchanger disposed in the heat exchange cavity, wherein:
- the heat dissipation air duct has an inlet end located at a side of the heat exchanger facing towards the fan assembly; and
- after flowing into the heat exchange cavity, an airflow in the fan cavity at least partially flows into the heat dissipation air duct to exchange heat with the heat exchanger.

12. The air conditioner according to claim 11, wherein:
- the housing further comprises a pipeline cavity isolated from the heat exchange cavity by the support member; and
- the heat dissipation air duct is located between the pipeline cavity and the electric control box.

13. The air conditioner according to claim 7, further comprising:
- an air guide hood disposed at the fan cavity and configured to guide an airflow towards the heat exchange cavity.

14. The air conditioner according to claim 13, wherein:
- the air guide hood has an air supply outlet arranged to face towards the heat exchange cavity; and
- a side wall of the air guide hood has a guide inclined surface located at the air supply outlet, the guide inclined surface extending towards an inlet end of the heat dissipation air duct.

15. The air conditioner according to claim 13, wherein:
- the air guide hood has an air inlet arranged to face towards an air return inlet of the fan cavity; and
- the electric control box is disposed at a lateral side of the air guide hood.

16. The air conditioner according to claim 12, wherein an end portion of a refrigerant pipeline of the heat exchanger is located in the pipeline cavity and is in communication with an external pipe in a refrigerant cavity to allow an input and an output of a refrigerant.

* * * * *